United States Patent [19]

Houk et al.

[11] Patent Number: 4,481,430
[45] Date of Patent: Nov. 6, 1984

[54] POWER SUPPLY THRESHOLD ACTIVATION CIRCUIT

[75] Inventors: William R. Houk, Westbrook, Me.; Hayagriva V. Rao, Fairchild, Conn.

[73] Assignee: Fairchild Camera & Instrument Corp., Mountain View, Calif.

[21] Appl. No.: 404,318

[22] Filed: Aug. 2, 1982

[51] Int. Cl.³ .............. H03K 17/22; H03K 17/30; H03K 17/62; H03K 19/007
[52] U.S. Cl. ............... 307/296 R; 307/200 A; 307/442; 307/456; 307/473
[58] Field of Search ............ 307/442, 443, 200 A, 307/473, 456–458, 360, 296 R, 64

[56] References Cited

U.S. PATENT DOCUMENTS

| | | | |
|---|---|---|---|
| 3,725,675 | 4/1973 | Olsen | 307/200 A |
| 4,174,541 | 11/1979 | Schmitz | 307/456 X |
| 4,260,909 | 4/1981 | Dumbri et al. | 307/297 |
| 4,288,865 | 9/1981 | Graham | 307/297 X |
| 4,398,106 | 8/1983 | Davidson et al. | 307/200 A X |
| 4,415,817 | 11/1983 | Fletcher | 307/456 X |

Primary Examiner—Stanley D. Miller
Assistant Examiner—David R. Hudspeth
Attorney, Agent, or Firm—Kenneth Olsen; Carl L. Silverman; Daniel H. Kane, Jr.

[57] ABSTRACT

An improved tristate enable circuit is described for activating a tristate enable gate to maintain the high impedance third state of a common bus tristate output device during "power down" and "power up" transitions of the common power supply $V_{cc}$. The enable gate circuit element tends to turn off at a voltage level $V_{cc2}$ generally greater than the voltage level $V_{cc3}$ at which the tristate output device circuit elements turn off. As a result the high impedance state may be lost during "power down". A threshold activation circuit is coupled to the enable gate for activating the enable gate when the threshold activation circuit senses a higher common power supply voltage level $V_{cc1}$. The threshold activation circuit operatively activates the enable gate over a voltage range from $V_{cc1}$ to a lesser common power supply voltage level $V_{cc4}$. Component values are selected for relating the voltage levels so that $V_{cc1} > V_{cc2}$ and $V_{cc3} > V_{cc4}$. As a result the turn off of circuit elements is sequenced by the threshold activation circuit.

20 Claims, 5 Drawing Figures

FIG I (PRIOR ART)

POWER SUPPLY THRESHOLD ACTIVATION CIRCUIT

TECHNICAL FIELD

The present invention relates to a new power supply threshold activation circuit for sequencing the turn on and turn off of multiple circuit devices or subcircuits dependent on a common power supply. The invention is particularly applicable in tristate enable circuits for maintaining the high Z or high impedance third state of a common bus tristate output device during power down, power up, and power out transitions of the common power supply. More generally the invention is useful in any application where a portion of circuitry must be kept active or for introducing a backup power supply during power transitions or power outages of the conventional power supply.

BACKGROUND ART

In electronic circuit applications where more than one output is tied to a single connecting line or common bus, the use of tristate output devices is required. By way of example, a prior art Fairchild Advanced Schottky TTL three state or tristate output control device is illustrated in FIG. 1. Several elements or stages can be identified in such a TTL tristate output gate. The pullup element for sourcing current from the higher level voltage and power supply $V_{cc}$ consists of transistors Q12 and Q13 forming a Darlington current source. The Darlington current source supplies current from power supply $V_{cc}$ to the output $V_{out}$. The "pulldown" element or stage for sinking current and voltage from the output $V_{out}$ to ground consists of transistor Q14 with a conventional squaring network including transistor Q16 at its base. In the example of FIG. 1 the pulldown transistor Q14 also includes a turn off accelerating transistor Q15 and associated diodes for sinking Miller current and accelerating turn off of pull down transistor Q14 during transition from low to high at the output $V_{out}$. Step up transistor Q10 is coupled in series with the phase splitter Q11 to increase the input threshold at the logic data input $V_{in}$.

When a low level voltage, binary zero in positive logic, appears at the input $V_{in}$, a high level voltage, binary one, appears at the output $V_{out}$. In this state the pullup element Q12 and Q13 is conducting affording a low impedance path to the output from the high level voltage $V_{cc}$. The pulldown element Q14 is nonconducting affording a high impedance path to the low level voltage or ground.

When a high level voltage binary logic one appears at the input $V_{in}$, a low level voltage binary zero appears at the output $V_{out}$. In this state the pullup element Q12 and Q13 is nonconducting affording a high impedance blocking path from the high level voltage $V_{cc}$ to the output. The pulldown element Q14 is conducting affording a low impedance path from the output to ground.

The third state or high impedance state of the tristate device illustrated in FIG. 1 is afforded by the output enable terminal OE. When a low level potential or binary zero from the enable gate appears at terminal OE the active elements of the tristate device are deprived of base drive current. Thus, terminal OE provides a low impedance path to ground and all transistors become nonconducting. In this high impedance third state both the pullup element and pulldown element exhibit high impedance to signals appearing at the output $V_{out}$. With all the elements deprived of base current the output effectively becomes a high impedance to any exterior circuitry, for example, a common bus to which the output $V_{out}$ may be connected. In this condition the tristate output device will neither source nor sink current at the output $V_{out}$ and will behave effectively as if nothing were there. Such a tristate device is therefore particularly applicable and suitable for applications in which a plurality of output gates are tied together or coupled to a common bus structure. In such common bus applications only one output, that is only one of many output devices of the type illustrated in FIG. 1 coupled to the bus structure, determines the voltage (high or low) of the bus while the other outputs for the remaining gates are in the high impedance third state.

When a high level voltage binary one appears at the output enable terminal OE the output device functions as a bistate output device sinking or sourcing current at the output $V_{out}$ according to whether the pulldown or pullup element is conducting. It should be noted that the output device is inherently inverting as a binary zero at the input $V_{in}$ generates a binary one at the output $V_{out}$ and vice versa. As stated above only one such tristate output device of many coupled to the common bus is active at any one time.

The enable gate which delivers a high or low voltage signal, binary one or zero, to the output enable terminal OE is itself a bistate TTL gate. In order to relinquish the common bus, not shown, to another tristate output device which is actively passing logic data in a bistate mode, the enable gate must remain actively conducting through its own pulldown element. Thus, the enable gate pulldown element affords a low impedance path from the output enable terminal OE to ground, continuously sinking base current from the transistors of the tristate output device. It is essential that the enable gate remain continuously activated for sinking current in order to maintain the high impedance or high Z state and prevent interference with high and low signals on the bus.

In a bus system with multiple tristate output devices coupled to the single connecting line, it is common to "power down" the unused devices in the high Z state in order to reduce power consumption. A problem frequently occurs during such a power down transition with the high Z state output devices interfacing at the bus. During the power down and reduction in voltage the enable gate coupled to the tristate output device tends to turn off or deactivate before the elements of the tristate output device itself. Once the enable gate is deactivated and becomes nonconducting there is no longer a route to ground for the base drive current at the phase splitter transistor Q11 through the terminal OE. As a result there is a time interval during which the tristate output device phase splitter transistor Q11 and pull down element Q14 become conducting. The pulldown element Q14 affords a low impedance path to ground at the tristate output $V_{out}$ and therefore at the entire common bus affecting all other devices connected to the bus. The system reliability is therefore reduced during power down and power up voltage transitions at the power supply $V_{cc}$.

A further discussion of tristate output devices can be found, for example, in U.S. Pat. No. 4,311,927, issued Jan. 19, 1982, assigned to the assignee of the present invention; in U.S. Pat. No. 4,287,433, also owned by the present assignee; and in the FAST DATA BOOK, published 1982 by Fairchild Camera and Instrument Corporation, Digital Products Division, 333 Western Avenue, South Portland, Me. 04106. The prior art known to applicants does not directly address the problem of loss of the high Z state and therefore loss of reliability in tristate output devices during power down, power up, and power out transitions in the common power supply.

In U.S. Pat. No. 4,104,734, assigned to the assignee of the present application, the problem of protecting volatile random access memory cells during drop in the power supply voltage is addressed. According to this patent, a threshold type circuit is provided for detecting a drop in the system power supply voltage and for turning off bias networks in a sequence making it impossible to write into or change the data in a memory cell. The memory cells are thus protected while the power supply voltage is reduced to the minimum cell current requirements for maintaining the cell contents.

Threshold activation and control circuits and concepts have never been applied however to the unique requirements of tristate output devices and their associated enable gate circuits. More generally, such threshold circuits and concepts have not been applied to interdependent logic gate output circuits and subcircuits. Nor would the threshold detecting circuit of U.S. Pat. No. 4,104,734 be of a type that could optimally be applied in such environments all as hereafter described.

OBJECT OF THE INVENTION

It is therefore an object of the present invention to provide tristate output devices and associated enable gate circuits with high reliability in the high impedance or high Z third state even during power down, power up, and power out transitions of the common power supply.

Another object of the invention is to provide new enable gate circuits for sequencing the turn off or deactivation and turn on of circuit elements during power down and power up transitions of the common power supply so that spurious loss of high impedance coupling of the inactive devices at a common bus may not occur.

A further object of the invention is to provide a new and improved threshold activation and control circuit applicable for sequencing turn off and activation of interdependent circuits and subcircuits. Yet an additional object of the invention is to provide threshold activation and control circuits for introducing a backup power supply to maintain active circuit devices and subcircuits during power down transitions or power outages in the conventional power supply.

DISCLOSURE OF THE INVENTION

In order to accomplish these results the present invention contemplates providing an improved tristate enable circuit for activating a tristate enable gate to maintain the high impedance third state of a common bus tristate device during power down and power up transitions of the common power supply $V_{cc}$. This is true even when the enable gate circuit elements normally turn off at a higher voltage level $V_{cc2}$ than the lower voltage level $V_{cc3}$ at which the circuit elements of the common bus tristate device turn off. Thus, spurious introduction of high and low voltage signals at the common bus is avoided. To accomplish this the invention provides a threshold activation circuit coupled to the enable gate for activating the enable gate when the threshold activation circuit senses a common power supply voltage level $V_{cc1}$. The threshold activation circuit is designed for operatively activating the enable gate over a voltage range from $V_{cc1}$ to a lesser common power supply voltage level $V_{cc4}$. The threshold activation circuit component values are selected for operatively relating the voltage levels so that $V_{cc1} > V_{cc2}$ and $V_{cc3} > V_{cc4}$. A feature and advantage or this circuit selection is that the turn off of circuit elements is sequenced by the threshold activation circuit in the desired order.

In a preferred embodiment the threshold activation circuit comprises a threshold transistor and a threshold ladder circuit coupled to the terminals of the threshold transistor. The output of the threshold activation circuit is coupled through an inverting transistor to the enable gate pulldown element in parallel with the enable gate phase splitter. As a result, during a power down or power out transition with the operative voltage levels sequenced by the threshold activation circuit as set forth above, the threshold activation circuit begins driving the enable gate pulldown transistor in parallel with the phase splitter at a relatively higher voltage level $V_{cc1}$. During further loss of power a voltage level $V_{cc2}$ is reached at which the enable gate phase splitter element turns off. The threshold activation circuit however continues to drive the pulldown element of the enable gate providing a low impedance path to ground which continues to deprive the tristate output device of base drive current. The tristate output device seeing a low level potential or binary zero at the output enable terminal OE remains in the high Z state. Without the threshold activation circuit in accordance with the invention a high impedance would appear at terminal OE upon deactivation or turn off of the enable gate. As a result, the tristate output device may interfere with data passing on the bus from another device in the active bistate mode.

As the power down or power loss continues a voltage level $V_{cc3}$ is reached at which the tristate output device itself becomes deactivated and its active element transistors are no longer conducting. Below this voltage level spurious results on the common bus can no longer occur. Therefore, at a final lower voltage level $V_{cc4}$ the threshold activation circuit itself turns off. This sequence takes place in reverse during power up transitions of the power supply so that spurious voltage levels on the common bus are eliminated during transitions in either direction according to the present invention.

The threshold ladder circuit may take a number of forms but includes as basic elements at least a collector resistor coupled between the collector of the threshold transistor and the power supply; clamping devices such as diodes, and a base supply resistor coupled in series between the base of the threshold transistor and power supply; and a base to ground resistor coupled between the base of the threshold resistor and ground or low level potential. The output from the threshold activation circuit is taken from the collector of the threshold transistor through a coupling gate such as a diode or active element transistor according to the application. For use in enable gate circuit applications for controlling the high Z state of a tristate output device, a pass transistor inverter is used for coupling the threshold transistor to the enable gate pulldown element transistor while inverting the voltage signal.

More generally, the threshold activation circuit is applicable for sequencing the activation or turn off of interdependent multiple circuit devices or subcircuits during power down, power up, and power out transitions of the common power supply.

According to the another aspect of the invention the threshold activation circuit is used to control introduction of a separate or independent backup power supply, for example, into a memory board or other application where active subcircuits must be maintained during power down transitions or unintentional power losses.

Other objects, features, and advantage of the invention will become apparent in the following specification and accompanying drawings.

DESCRIPTION OF THE PREFERRED EMBODIMENTS AND BEST MODE OF THE INVENTION

Figure 1:
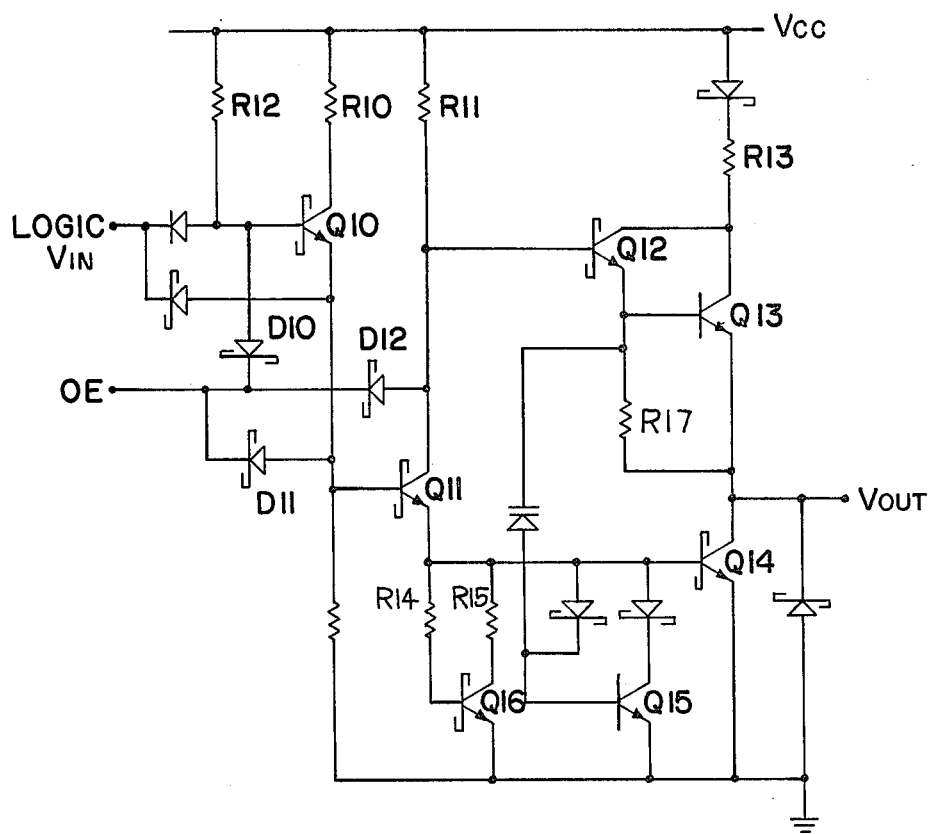
FIG. 1 is a circuit diagram or circuit schematic of a prior art tristate output device for the control of which the present invention is particularly applicable.
Figure 2:
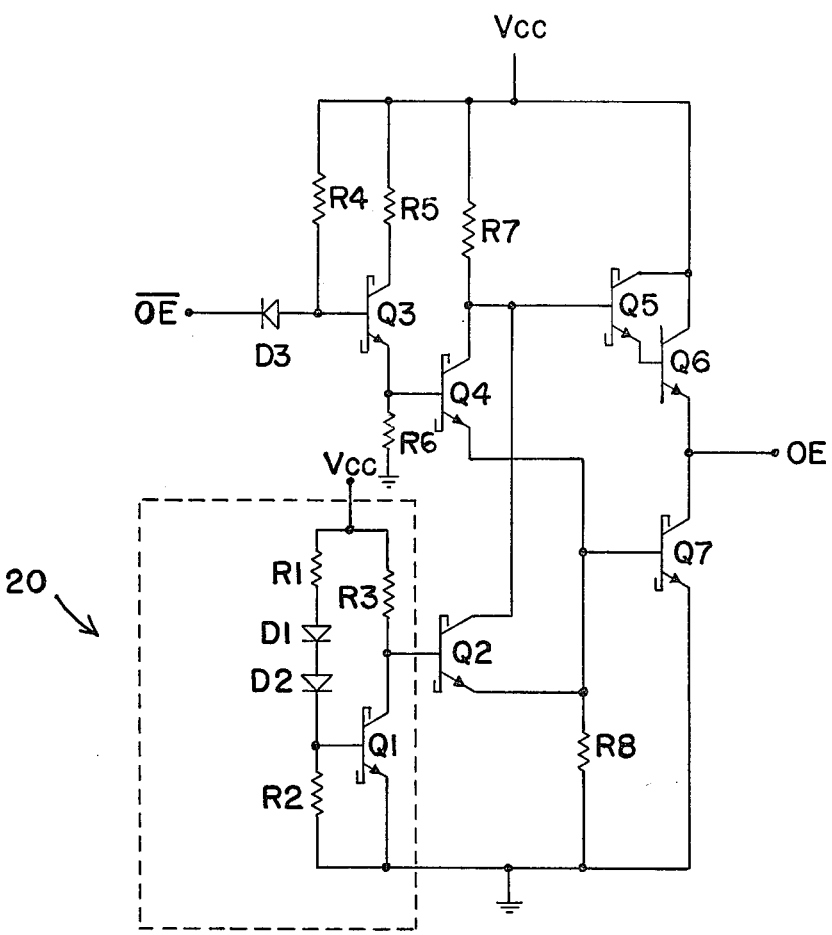
FIG. 2 is a circuit diagram or schematic diagram of an enable gate circuit and threshold activation circuit in accordance with the invention.

A tristate enable circuit modified in accordance with the present invention is illustrated in FIG. 2. Such an enable circuit is suitable for controlling tristate output devices of the type described above with reference to FIG. 1. The enable circuit also referred to as an enable gate is itself a TTL device. The primary operative element of the enable gate is the active element pulldown transistor Q7 which sinks current from the output OE of the enable gate when conducting. In this state of the enable gate the pullup element transistors Q5 and Q6 forming a Darlington are nonconducting and a binary zero or low potential appears at the output OE affording a low impedance path to ground from the collector to emitter of pulldown transistor Q7. In this condition the enable gate controls or holds an associated tristate output device in the high impedance or high Z third state.

When the pulldown transistor Q7 is nonconducting interposing a high impedance in the route to ground and the Darlington pullup element Q5 and Q6 is conducting a high potential or binary one appears at the output OE. A binary one or high voltage level at the terminal OE enables the associated tristate device to function in the bistate mode sourcing and sinking current at the common bus according to the logic data at the input $V_{in}$ as for example shown in FIG. 1.

The state or condition of the enable gate is controlled by phase splitter transistor Q4 and step-up transistor Q3 which increases the threshold voltage at the enable gate input OE for switching the enable gate.

The logic circuits illustrated in FIGS. 1 and 2 are typically incorporated in integrated circuits using any of a number of technologies, for example, MOS, CMOS, ECL, and Fairchild Advanced Schottky TTL (FAST) technologies. However, the invention is also applicable to discrete component circuits. During power down or power out transitions of the common power supply $V_{cc}$ there is a tendency in TTL integrated circuits for the enable gate to turn off or deactivate before the tristate output device. With enable gate pulldown transistor Q7 nonconducting, an interval of time therefore exists before turn off of the tristate output device when the output device is no longer held in the high Z state. As a result spurious signals may appear on the common bus interfering in the transfer of data from another output device, then in the active bistate mode. In particular the pulldown element of the tristate output device may become conducting pulling the common bus down to ground or low potential.

In order to avert this undesirable result, the invention incorporates a novel threshold activation circuit 20 as an integral part of the enable circuit. The threshold activation circuit includes an active element threshold transistor Q1 with circuit components coupled at its terminals between the high level power voltage $V_{cc}$ and low level ground potential or ground, in the form of a "threshold ladder" circuit. In particular, collector resistor R3 connects the collector of transistor Q1 to power supply $V_{cc}$. Clamping devices in this instant diodes D1 and D2 in series with base supply resistor R1 connect the base of transistor Q1 to the common power supply $V_{cc}$. The base to ground resistor R2 connects the base of transistor Q1 to ground or low level potential and the emitter of transistor Q1 is also connected to ground potential. The purpose of threshold activation circuit 20 is to sense a transition in the power supply voltage $V_{cc}$ and take corrective or preventive action to prevent the enable gate pulldown transistor Q7 from turning off before the tristate output device.

During normal static supply operation $V_{cc}$ is high enough to keep threshold transistor Q1 conducting. With threshold transistor Q1 conducting the coupling gate transistor Q2 according to the invention is deprived of base drive current and remains off.

Transistor Q2 is a pass transistor inverter used to interface or couple the threshold activation circuit 20 to the enable gate and is particularly suited for that purpose. In other applications a coupling gate other than a transistor, for example, a diode may be used.

In this example an inverting transistor Q2 is required for controlling the pulldown transistor Q7 of the enable gate. Transistor inverter Q2 is coupled with its collector and emitter in parallel with the enable gate phase splitter transistor Q4 and in this position is able to control and drive the pulldown transistor Q7 in the event the phase splitter transistor Q4 turns off.

As stated above during normal static power supply operations transistor Q1 is conducting and inverter transistor Q2 is off so that the threshold activation circuit does not affect the enable gate. The supply current for transistor Q1 and the power consumption in this standby condition is determined by resistors R1 and R3.

As power supply $V_{cc}$ is reduced a threshold $V_{cc1}$ is reached where Q1 will no longer conduct. This voltage threshold is given approximately by the following equation:

$$V_{cc1} = V_{D1} + V_{D2} + V_{BEQ1}\left(1 + \frac{R1}{R2}\right), \quad (1)$$

where $V_{D1}$ and $V_{D2}$ are the voltage drops across diodes D1 and D2 respectively and $V_{BEQ1}$ is the voltage drop across the base to emitter junction of threshold transistor Q1. This voltage threshold $V_{cc1}$ may be adjusted by appropriate values for R1 and R2, and the number of clamping devices, in this instance diodes. At voltage levels below the threshold $V_{cc1}$, threshold transistor Q1 turns off and inverter transistor Q2 turns on as a result of base drive current through resistor R3. The coupling transistor Q2 in turn supplies base drive current to the enable gate pulldown transistor Q7 holding it on in the conducting state. At the same time the emitter to collector low impedance conducting path of transistor Q2 holds the Darlington consisting of transistors Q5 and Q6 off and nonconducting.

The enable gate phase splitter transistor Q4 and the threshold activation circuit coupling transistor Q2 thus cooperate in parallel to maintain a high Z or high impedance third state in the associated tristate output device connected to terminal OE. From another perspective, the enable gate phase splitter transistor Q4 and the threshold activation circuit coupling gate transistor Q2 effectively comprise a two input logic OR gate. One input Q4 of the logic OR gate receives the tristate enable signal from $\overline{OE}$ while the other input Q2 of the logic OR gate receives the threshold signal from the threshold activation circuit 20. The output of the effective logic OR gate formed by transistors Q4 and Q2 is coupled to drive the base of enable gate pulldown transistor Q7 when either a logic high level tristate enable signal at $\overline{OE}$, or a logic high level threshold signal from the threshold activation circuit appears at an input of the logic OR gate as illustrated in FIG. 2.

As the power supply $V_{cc}$ continues in a downward or power down transition, there is a point $V_{cc2}$ where phase splitter transistor Q4 shuts off. This is given approximately by the following equation:

$$V_{cc2} = \frac{R4 R5}{R4 + R5}\left[ VBE\left(\frac{3}{R4} + \frac{2}{R5} + \frac{2}{R6}\right) + VSAT\frac{1}{R5}\right] \quad (2)$$

where VBE is the voltage drop across the base to emitter junction and VSAT is the voltage drop across the collector to emitter junction of the transistor in saturation.

In TTL integrated circuit technologies it is frequently the case that the enable gate circuit elements and in particular the phase splitter transistor Q4 turns off during a downward transition of the power supply $V_{cc}$ before the elements of the tristate output device. In accordance with the invention therefore the circuit component values are selected so that $V_{cc1} > V_{cc2}$. Thus, when the voltage level $V_{cc2}$ is reached and phase splitter transistor Q4 turns off, the coupling gate transistor Q2 alone carries current to the enable gate pulldown transistor Q7 keeping it on. In other words, the high level voltage or logic high level threshold signal from threshold activation circuit 20 through coupling transistor Q2 maintains activation of the enable gate pulldown transistor Q7 and keeps transistor Q7 conducting regardless of the level of the tristate enable signal input at $\overline{OE}$. With Q7 conducting the output OE of the enable gate remains low, binary zero, and hence the tristate output device with which it is associated remains in the high Z state and does not perturb the system bus.

As the power down continues the voltage level of power supply $V_{cc}$ reaches a lower level $V_{cc3}$ at which the tristate device itself or other external circuit turns off. Referring to FIG. 1 the turn off level for tristate output device pulldown transistor Q14 is a function of the voltage drop, VBE, across the base emitter junctions of transistors Q10, Q11 and Q14 and is also a function of the various resistors R10, R11, R12, R14 and R15. The turn off of the Darlington is a function of VBE across transistors Q12 and Q13 along with other circuit components including resistors R11 and R17. While the turn off voltage of the pullup and pulldown transistors of the tristate output device of FIG. 1 may differ slightly, the turn off voltage range is referred to collectively as $V_{cc3}$. $V_{cc3}$ is also a function of the potentials at the common bus presented by another tristate output device in the active bistate mode. In any event the voltage range over which complete turn off of the tristate output device results, and in particular the lower level of such voltage range is characterized herein by the designation $V_{cc3}$.

Finally, there will be a point $V_{cc4}$ where the threshold activation circuit 20 will turn off given approximately by the following equation:

$$V_{cc4} = \frac{R3 R7}{R3 + R7}\left[ VBE\left(\frac{2}{R3} + \frac{1}{R7} + \frac{1}{R8}\right) + VSAT\frac{1}{R7}\right] \quad (3)$$

This is the voltage level at which transistor inverter Q2 turns off. The component values are selected to assure that $V_{cc3} > V_{cc4}$. Since the threshold activation circuit is the last subcircuit or circuit portion to shut down and turn off, it is assured that the associated enable gate maintains the tristate output device in the high Z state until the high Z output device itself turns off. In other words, the threshold activation circuit 20 provides a logic high level threshold signal through coupling transistor Q2 whenever the common power supply voltage is in the range of $V_{cc1}$ to $V_{cc4}$ inclusive to ensure that the enable gate pulldown transistor element Q7 remains conducting. The result according to the invention is that the tristate output device never loads the system bus during power down transitions. That is, it never forces the bus either to high or low potential during power transitions or power loss. Any device active on the system bus during power down is free to control the system bus without interference from other devices on the bus. All the tristate output devices except the one active device relinquish the system bus for data transmission by the active device.

Thus, in common bus tristate output integrated circuit applications where the turn off voltage level $V_{cc2}$ of the enable gate may be higher than the turn off level $V_{cc3}$ of the tristate device, the invention provides a corrective measure. The invention provides a threshold activation circuit activated at the higher voltage level $V_{cc1}$ to maintain the high impedance Z state through a voltage range to a lower voltage level $V_{cc4}$. According to the conditions of the invention, the component values are selected so that $V_{cc1} > V_{cc2}$ and $V_{cc3} > V_{cc4}$. Typical values of the voltage levels in Fairchild Advanced Schottky TTL integrated circuit technology are as follows. The power supply $V_{cc}$ is typically at 5 volts. $V_{cc1}$ is typically about 2.8 volts while $V_{cc2}$ is approximately 2.6 volts. The turn off voltage $V_{cc3}$ of the tristate output device is typically in the range of 1.9 to 2 volts. The threshold activation circuit itself remains operative through the lower voltage level $V_{cc4}$ of approximately 1.75 volts. By this threshold voltage level relationship achieved by the present invention the threshold activation circuit which drives the tristate enable circuitry will be active longer than the tristate output device. Furthermore, during a power up transition the threshold activation circuit and enable gate will come on first so that no interference can occur at the system bus. Thus, the invention functions as well for power up transitions as power down transitions.

Figure 3:
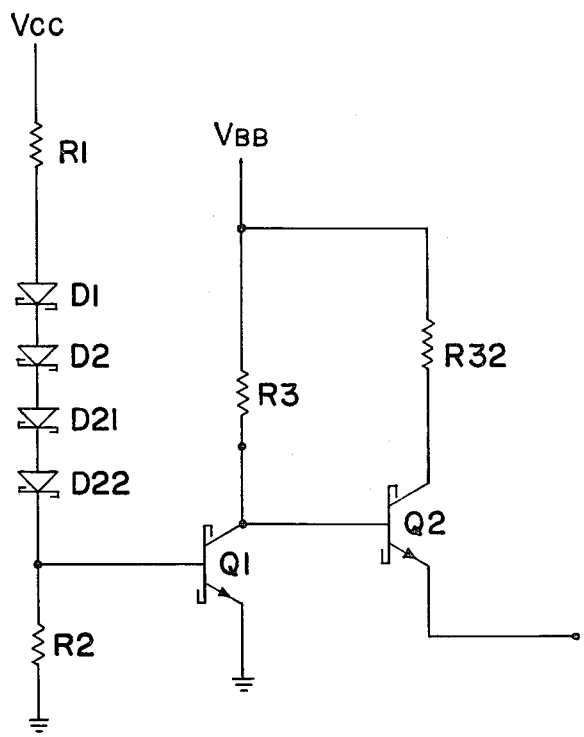
FIG. 3 is a circuit diagram or schematic diagram of a threshold activation circuit for use in introducing an independent backup power supply and showing variations in the voltage clamping devices.

A variation of the threshold activation circuit in accordance with the present invention is illustrated in FIG. 3. Components analogous or similar to those shown in FIG. 2 are given the same symbol designations. In this example the collector of threshold transistor Q1 is coupled through collector resistor R3 to an independent backup power supply $V_{BB}$ such as a backup battery and battery trickle charger. The coupling gate transistor or inverter transistor Q2 is similarly coupled to the backup power supply $V_{BB}$ through a collector resistor R32. The variation of the invention illustrated in FIG. 3 is suitable for applications where active circuit must be maintained despite unintentional power outages. Thus, the circuit of FIG. 3 is applicable not only for sequencing the shutdown of multiple circuit devices or subcircuits but also for maintaining circuits in an active state by introducing a backup power supply $V_{BB}$ in the event of complete loss of the conventional power supply $V_{cc}$.

Another variation according to the invention shown in FIG. 3 is the modification of the threshold ladder circuit to include the four clamping devices, D1, D2, D21, and D22. In this instance, the clamping devices are diodes, for example, Schottky diodes, positioned in series with resistor R1 in the base power supply circuit line. According to the invention variation in the threshold of activation of threshold transistor Q1 may be accomplished by changing the values of the resistors R1 and R2 or by changing the clamping structures, in this instance, diodes. The use of clamping devices in the threshold ladder circuit constitutes a feature and advantage of the present invention. By the use of one way passive elements such as diodes the desired threshold activation voltage can be selected using a smaller ratio of resistance values for resistors R1 and R2, and larger values for R1 and R2 which reduce power consumption. This also affords better tracking of the threshold voltage $V_{cc1}$ relative to changes in $V_{cc2}$ with variations in temperature. The number of diodes may be varied to change the threshold in the threshold ladder in a more efficient manner. The typical voltage drop $V_{SD}$ across the Schottky diode is approximately 0.5 volts and the number can be varied as shown in FIG. 3 so that $V_{cc1} > V_{cc2}$.

Figure 4:
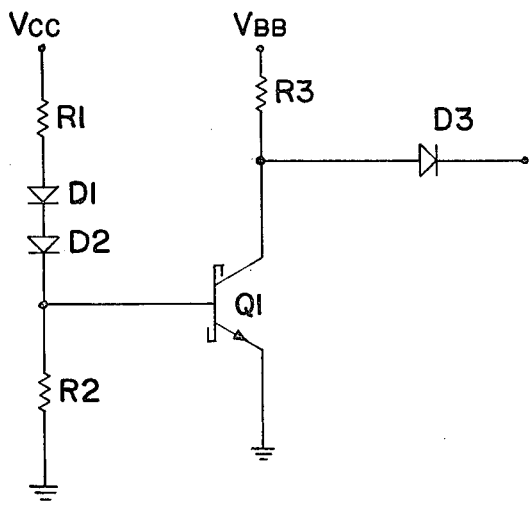
FIGS. 4 and 5 are additional circuit diagrams showing further variations and alternatives in the threshold activation circuit according to the invention.

In applications where an inverting transistor Q2 is not required as the coupling gate at the output of the threshold activation circuit 20, or variations thereof, a diode D3 may be used as the coupling gate as illustrated in FIG. 4. Components the same as or analogous to those of FIGS. 2 and 3 are designated by the same symbols. The circuit of FIG. 4 provides introduction of an independent backup power supply $V_{BB}$ through the coupling gate D3 at a desired threshold voltage level. The circuit may be used in applications where a subcircuit or circuit device is to be maintained in an active state despite power outage, for example, as a backup for active memories.

Figure 5:
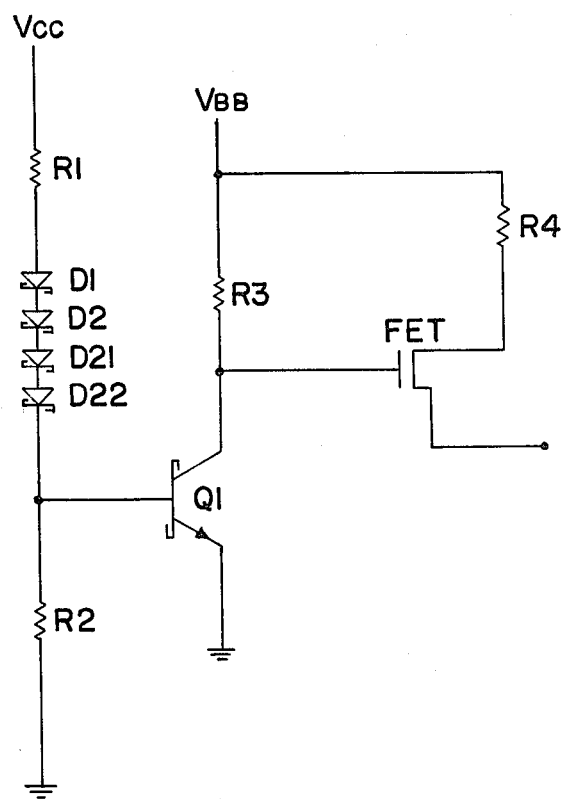

Another variation of the threshold activation circuit of the type illustrated in FIG. 3 is shown in FIG. 5. In this example the coupling gate at the output of the threshold activation circuit is a field effect transistor FET and may be useful, for example, in applications with memory boards.

More generally, the threshold activation circuit in accordance with the present invention is useful and applicable for sequencing the turn on or turn off of multiple circuit devices, subcircuits or circuit portions dependent upon a common power supply. However, the invention is also applicable for introducing a backup power supply at the desired threshold voltage level of a conventional power supply, not only for sequencing multiple circuits, but also for maintaining external circuits, circuit devices, subcircuits, etc. in an active state during power outage.

While the invention has been described with reference to particular example embodiments, it will be appreciated that it is intended to cover all variations and equivalents within the scope of the following claims.

We claim:

1. A threshold activation circuit for sequencing turn off or activation of first and second interdependent circuit devices of subcircuits during power out, power down, and power up transitions of the common power supply $V_{cc}$, where said second circuit device turns off at common power supply voltage $V_{cc3}$ and where said first circuit device turns off at common power supply voltage level $V_{cc2}$, said threshold activation circuit comprising a threshold transistor and threshold ladder circuit coupled to the terminals of said threshold transistor, said threshold ladder circuit comprising collector resistor means coupled between the collector of said threshold transistor and the common power supply $V_{cc}$, diode clamping means and base supply resistor means coupled in series between the base of the threshold transistor and common power supply $V_{cc}$, base to ground resistor means coupled between said base and ground, the emitter of said threshold transistor being coupled to ground, and gate output means coupling the collector of said threshold transistor to the first circuit device, said threshold ladder circuit constructed and arranged for operatively maintaining activation of said first circuit device at a common power supply voltage level $V_{cc1}$ and for maintaining activation of said first circuit device over a voltage range from $V_{cc1}$ to at least a lesser common power supply voltage level $V_{cc4}$, said threshold ladder circuit comprising component values selected for operatively relating said common power supply voltage levels so that $V_{cc1} > V_{cc2}$ and $V_{cc3} > V_{cc4}$, whereby the sequence of turn off or activation of the circuit devices is controlled by the threshold activation circuit means.

2. The threshold activation circuit of claim 1 wherein said gate output means comprises diode means.

3. The threshold activation circuit of claim 1 wherein said gate output means comprises coupling transistor means.

4. The threshold activation circuit of claim 1 wherein said diode clamping means comprises a plurality of diodes.

5. A threshold activation circuit for maintaining activation of a circuit device using a backup power supply $V_{BB}$ during "power out", "power down", and "power up" transitions of a standard common power supply $V_{cc}$ where the circuit device turns off at a common power supply voltage level $V_{cc2}$, said threshold activation circuit comprising:

threshold transistor means and threshold ladder circuit means coupled to the terminals of said threshold transistor means, said threshold ladder circuit means comprising collector resistor means coupled between the collector of said threshold transistor means and the backup power supply $V_{BB}$, diode clamping means and base supply resistor means coupled in series between the base of the threshold transistor means and the common power supply $V_{cc}$, base to ground resistor means coupled between said base and ground, the emitter of said threshold transistor means being coupled to ground, and gate output means coupling the collector of the threshold transistor means to the circuit device, said threshold ladder circuit means comprising component values selected for operatively maintaining activation of the circuit device using the backup power supply $V_{BB}$ over a range of common power supply voltage levels from $V_{cc1} > V_{cc2}$ to $V_{cc4} < V_{cc2}$.

6. The threshold activation circuit of claim 5 wherein said gate output means comprises diode means.

7. The threshold activation circuit of claim 5 wherein said gate output means comprises coupling transistor means.

8. The threshold activation circuit of claim 5 wherein said diode clamping means comprises a plurality of diodes coupled in series.

9. An improved tristate enable gate having a tristate enable signal input (OE), enable gate phase splitter transistor means (Q4) operatively coupled to receive logic high and low voltage level tristate enable signals, pulldown transistor means (Q7) operatively coupled to the phase splitter transistor means (Q4), said pulldown transistor means (Q7) conducting when a logic high voltage level signal is applied by the enable gate phase splitter transistor means (Q4) to the base of the pulldown transistor means (Q7), and an enable gate output (OE) for maintaining a common bus tristate output device (FIG. 1) in the high impedance third state when the enable gate pulldown transistor means (Q7) is conducting, said tristate enable gate and tristate output device having a common power supply $V_{cc}$, wherein the improvement comprises:

said enable gate phase splitter transistor means comprises a logic OR gate having at least two inputs, one input (Q4) coupled to receive the logic high and low voltage level tristate enable signals;

threshold activation circuit means (20) operatively coupled to the other input (Q2) of the phase splitter transistor means logic OR gate and to the common power supply $V_{cc}$, said threshold activation circuit means (20) constructed and arranged for delivering a logic high level voltage threshold signal to said logic OR gate input when the common power supply voltage is in the range from a first voltage level $V_{cc1}$ to at least a lesser voltage level $V_{cc4}$;

said enable gate phased cc1 to $V_{cc4}$ regardless of the logic high or low voltage level of the tristate enable signal for maintaining the high impedance third state of a common bus tristate output device (FIG. 1) during "power down" and "power up" transitions of the common power supply $V_{cc}$.

10. The enable gate of claim 9 wherein the enable gate phase splitter transistor means (Q4) and pulldown transistor means (Q7) normally turn off when the common power supply reaches a voltage level $V_{cc2}$, wherein the common bus tristate output device is formed with pullup and pulldown transistor elements which normally turn off at a common power supply voltage level $V_{cc3}$, and wherein the threshold activation circuit comprises components having values selected for operatively relating the common power supply voltage levels so that $V_{cc1} > V_{cc2}$ and so that $V_{cc3} > V_{cc4}$.

11. The enable gate of claim 9 wherein the enable gate phase splitter transistor means logic OR gate comprises a phase splitter transistor (Q4) and a coupling transistor (Q2) having its collector and emitter current paths coupled in parallel with the collector and emitter current paths of the phase splitter transistor (Q4), the base of the phase splitter transistor (Q4) being coupled to receive tristate enable signals and the base of said coupling transistor (Q2) being operatively coupled to receive threshold signals from the threshold activation circuit means (20).

12. The enable gate of claim 9 wherein the threshold activation circuit means (20) comprises a threshold transistor (Q1) and a threshold ladder circuit, the collector and base of the threshold transistor (Q1) being coupled to the common power supply $V_{cc}$ through said threshold ladder circuit, said threshold ladder circuit comprising a collector resistor (R3) coupled between the collector of the threshold transistor (Q1) and the common power supply $V_{cc}$, a base supply resistor (R1) and diode clamping means (D1, D2) coupled in series between the base of threshold transistor (Q1) and the common power supply $V_{cc}$, and a base ground resistor (R2) coupled between the base of the threshold transistor (Q1) and ground, the emitter of threshold transistor (Q1) being coupled to ground.

13. The enable gate of claim 12 wherein:

$$V_{cc1} = V_{D1} + V_{D2} + VBE_{Q1}\left(1 + \frac{R1}{R2}\right)$$

where $V_{D1}$ and $V_{D2}$ are the voltage drops respectively across the clamping diode means (D1, D2) and $VBE_{Q1}$ is the voltage drop across the base to emitter of the threshold transistor (Q1).

14. The enable gate of claim 9 wherein the threshold activation circuit means comprises a threshold transistor (Q1), diode clamping means (D1, D2) and base supply resistor means (R1) coupled in series between the base of threshold transistor (Q1) and the common power supply $V_{cc}$, base ground resistor means (R2) coupled between the base of threshold transistor (Q1) and ground, the emitter of threshold transistor (Q1) being coupled to ground, an independent backup power supply ($V_{BB}$), and collector resistor means (R3) coupled between the collector of threshold transistor (Q1) and the backup power supply ($V_{BB}$), the collector of threshold transistor (Q1) coupled to said input of the enable gate phase splitter transistor means logic OR gate.

15. The enable gate of claim 14 wherein the enable gate phase splitter transistor means logic OR gate comprises a phase splitter transistor (Q4) having the base terminal coupled to receive tristate enable signals, and a coupling transistor (Q2) having its base terminal coupled to receive threshold signals from the collector of the threshold transistor (Q1), said coupling transistor (Q2) having its collector-emitter current path coupled in parallel with the collector-emitter current path of the phase splitter transistor (Q4).

16. The enable gate of claim 14 wherein the enable gate phase splitter transistor means logic OR gate comprises a phase splitter transistor (Q4) having its collector-emitter current path coupled to the output of said logic OR gate, and a coupling diode (D3) having its diode output current path coupled to the output of said logic OR gate, the base of the phase splitter transistor (Q4) being coupled to receive tristate enable signals and the input of the coupling diode (D3) being operatively coupled to receive threshold signals from the collector of the threshold transistor (Q1).

17. The enable gate of claim 14 wherein the coupling transistor comprises a field effect transistor (FET).

18. The enable gate of claim 12 wherein the clamping diode means comprise more than 2 diodes (D1, D2, D21, D22) coupled in series.

19. An improved tristate enable gate having a tristate enable signal input ($\overline{OE}$) for receiving tristate enable signals, phase splitting transistor means (Q4), pulldown transistor means (Q7), enable gate output (OE) for maintaining the high impedance third stste of a common bus tristate output device (FIG. 1) when the pulldown transistor means (Q7) is conducting, and common power supply voltage source $V_{cc}$ wherein the improvement comprises:

said phase splitting transistor means comprises a logic OR gate having at least two inputs, one input (Q4) coupled to receive tristate enable signals;

threshold activation circuit means (20) operatively coupled to the other input (Q2) of the logic OR gate, said threshold activation circuit means (20) constructed and arranged for applying a logic high level voltage signal to said logic OR gate input when the common power supply voltage is in a range from a first voltage level $V_{cc1}$ to at least a lesser voltage level $V_{cc4}$ inclusive;

said logic OR gate having an output coupled to the base of the pulldown transistor means (Q7) so that the pulldown transistor means (Q7) is conducting when the common power supply voltage level is in the range of $V_{cc1}$ to $V_{cc4}$ for maintaining the high impedance third state of a common bus tristate output device (FIG. 1) during "power down" and "power up" transitions of the common power supply voltage source $V_{cc}$.

20. An improved tristate enable gate for maintaining the high impedance third state of a common bus tristate output device during "power down" and "power up" transitions of the common power supply $V_{cc}$, said enable gate having enable gate phase splitter and pulldown transistor elements which normally turn off at common power supply voltage level $V_{cc2}$, the common bus tristate output device having output device pullup and pulldown transistors which normally turn off at common power supply voltage level $V_{cc3}$ wherein the improvement comprises:

threshold activation circuit means operatively coupled to the enable gate and the common power supply $V_{cc}$ for applying a logic high level voltage signal to the base of the enable gate pulldown transistor element when the threshold activation circuit means senses a common power supply voltage level $V_{cc1}$ so that the pulldown transistor element remains conducting and maintains the high impedance third state of a common bus tristate output device, said threshold activation circuit means constructed and arranged for operatively applying the logic high level voltage signal to the base of the pulldown transistor element over a voltage range from common power supply voltage level $V_{cc1}$ to at least a lesser common power supply voltage level $V_{cc4}$, said threshold activation circuit means comprising components having values selected for operatively relating said common power supply voltage levels so that $V_{cc1} > V_{cc2}$ and $V_{cc3} > V_{cc4}$ whereby the turn off or activation of the tristate output device pullup and pulldown transistors and the enable gate pulldown transistor element (Q7) is sequenced by the threshold activation circuit means.

* * * * *